United States Patent [19]

Kwon et al.

[11] Patent Number: 5,371,498
[45] Date of Patent: Dec. 6, 1994

[54] CIRCUIT FOR RECOGNIZING KEY INPUTS

[75] Inventors: Soon D. Kwon; Byeong S. Yoon, both of Seoul, Rep. of Korea

[73] Assignee: Samsung Electronics Co., Ltd., Kyungki, Rep. of Korea

[21] Appl. No.: 15,787

[22] Filed: Feb. 10, 1993

[30] Foreign Application Priority Data

Feb. 29, 1992 [KR] Rep. of Korea ............. 92-3382

[51] Int. Cl.$^5$ .............................. G06F 3/02
[52] U.S. Cl. .......................... 341/24; 341/25
[58] Field of Search ..................... 341/24, 25

[56] References Cited

U.S. PATENT DOCUMENTS 4,231,016 10/1980 Ueda ........................ 341/24
4,293,849 10/1981 Lacy ......................... 341/24
5,153,572 10/1992 Caldwell et al. .............. 341/24

FOREIGN PATENT DOCUMENTS 35626 3/1979 Japan ................ G06F 3/02
1103317 4/1989 Japan ................ H04N 17/00

Primary Examiner—James J. Groody
Assistant Examiner—Glenton B. Burgess
Attorney, Agent, or Firm—Sughrue, Mion, Zinn, Macpeak & Seas

[57] ABSTRACT

A circuit for recognizing double key inputs includes a key input part, a key signal generating part, a comparing circuit and a detecting part, the key signal generating part operates simultaneously with the key input of the key input part and generates a key signal which is provided to the comparing circuit which outputs a high level only at the time of two or more key inputs. A high level output of the comparing circuit is added to an output voltage of the key input part when two or more keys are pressed. The circuit provides the advantage that double key inputs can be easily recognized with a minimum number of key input lines.

7 Claims, 2 Drawing Sheets

CIRCUIT FOR RECOGNIZING KEY INPUTS

FIELD OF THE INVENTION

The present invention relates to a key recognizing circuit for recognizing key inputs in an analog key manner, in which a plurality of key inputs are recognized by a minimum number of key input lines.

BACKGROUND OF THE INVENTION

A method in which the key input can be recognized by a minimum number of signal lines has been needed because multiple lines, such as scanning lines, cannot be used in the structure of inputs by separated keys or a fuzzy chip such as a cleaner. Generally, a fuzzy chip and a circuit receiving a separated key or an analog input form a system which is able to recognize a key input with a minimum number of signal lines without scanning lines. Therefore, for such a structure of a separated key or fuzzy chip, such as a cleaner, multiple lines, such as key scan lines cannot be used, and a method is required for recognizing the keys with a minimum number of lines.

To solve this problem, each of the keys can be constructed so as to be provided with a different level of input voltage from each other. However, while this enables the recognition of key inputs by a minimum number of signal lines, a circuit for applying different voltage levels to a key input circuit according to each key is very complicated. Particularly, if two or more keys are pressed, recognizing errors of key inputs can occur and it is difficult to detect same.

FIG. 1 shows a block diagram of a conventional switch multiple selection detecting circuit as disclosed in Japanese Laid-Open Publication No. Pyung Sung 1-103317. The circuit includes a plurality of switches 1 arranged in a matrix, a switching driving circuit 7 for driving the switches 1 by means of a clock, a flip-flop 2 for memorizing a switch state of the switches in a constant period as driven by the switch driving circuit 7, a multiple selection detecting part 4 for determining whether or not the switch is multiple-selected from the output of the flip-flop 2 and a strobe signal generating part 13 for outputting a signal when a multiple selection does not occur so that a low level signal is output when the multiple switch is selected, whereas when the multiple switch is not selected, the high level signal is output by a strobe signal output OK. As shown in FIG. 1, strobe signal generating part 13 may include an AND gate having a pair of inverted inputs. One of these inputs receives an output 9 from detecting part 4, and the other one of the inputs receives an output 8 from circuit 3 which is an NAND gate coupled to receive outputs of the flip-flop 2. As also shown in FIG. 1, the clock provided to circuit 7 and flip-flop 2 is provided by the circuit including NAND gate 11 and inverter 12. In the conventional circuit, the output is stopped, if multiple switches are selected, and otherwise, the operation according to the input key is performed. Accordingly, the existence of the multiple switch selection is determined only to perform a more accurate operation, and the method for recognizing multiple key inputs by one line has not been suggested. Also, while multiple switch selection key input errors are detected by stopping the output, the constitution of the circuit is rather complicated.

SUMMARY OF THE INVENTION

The present invention solves the above-noted problems and provides a simplified circuit for recognizing double key inputs in which a plurality of key inputs are easily recognized by a minimum number of signal lines without key scan lines.

The recognizing circuit according to the present invention comprises a key input part having a plurality of keys for providing voltages corresponding to a level set by way of resistors upon key input, a key signal generating part for providing a low voltage level in case of one key input and for providing a high voltage level in case of two or more key inputs at the key input part, a comparing circuit connected to an output end of the key signal generating part, for outputting a voltage at a high level at the time of one key input and for outputting a voltage at a low level at the time of two or more key inputs, and a detecting part connected to an output of the comparing circuit and the key input part, for adding the output voltage of the comparing circuit to the voltage of the output line.

DETAILED DESCRIPTION OF THE PREFERRED EMBODIMENT

A preferred embodiment of a circuit according to the present invention will now be described in detail below.

Figure 1:
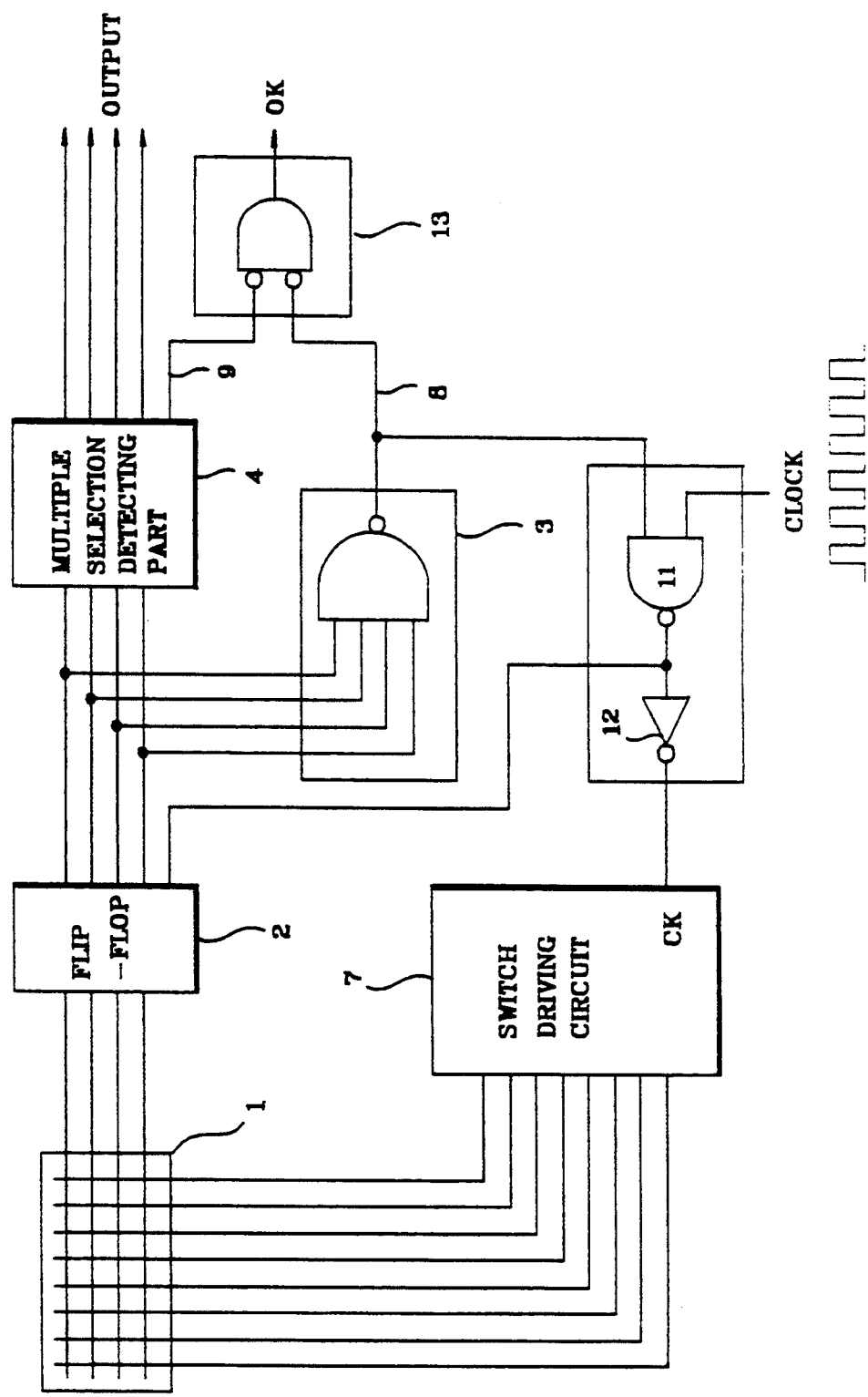
FIG. 1 is a block diagram of a conventional multiple switch selection detecting circuit.
Figure 2:
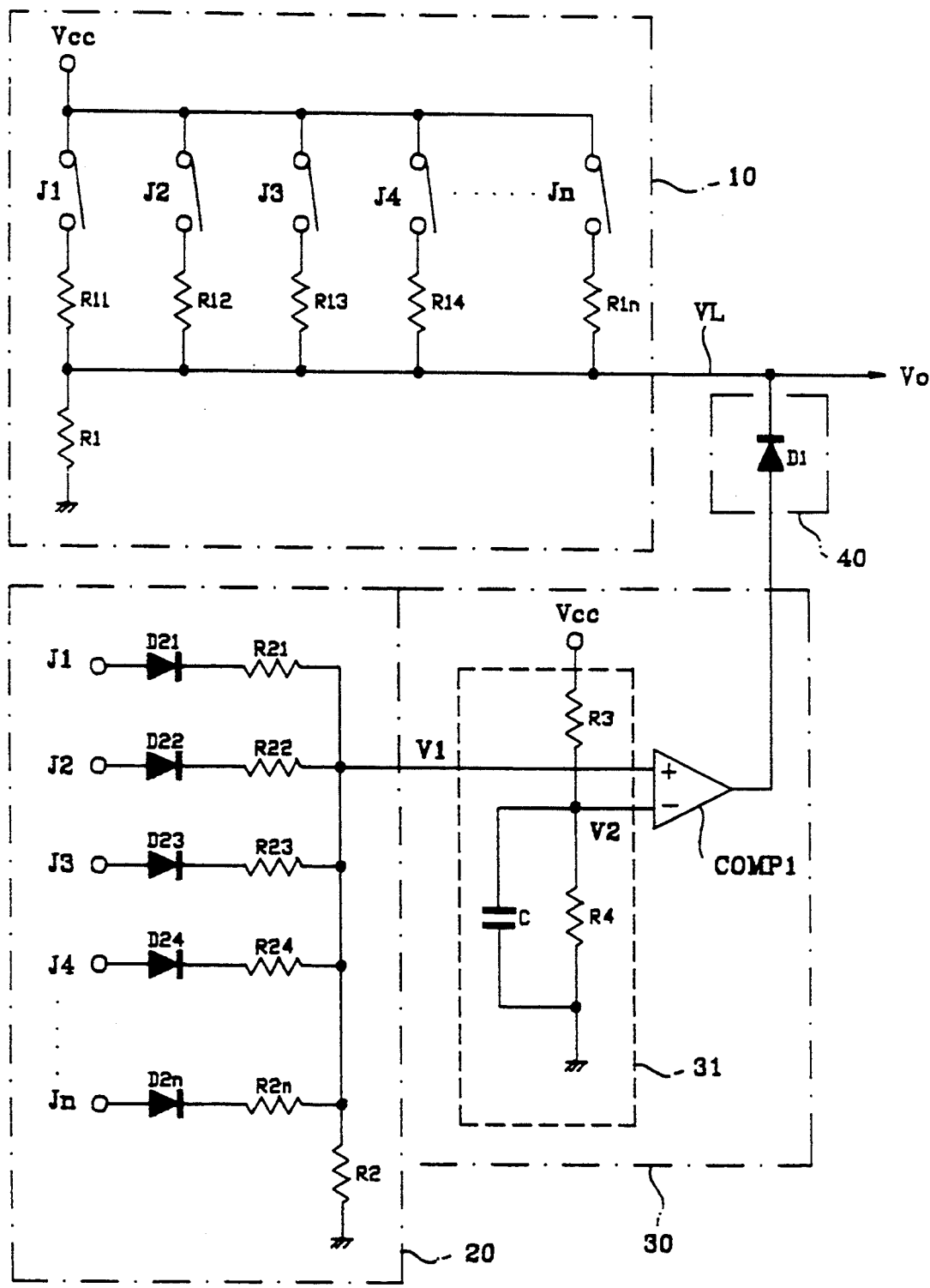
FIG. 2 is a circuit diagram of a circuit according to an embodiment of the present invention.

FIG. 2 shows a circuit for recognizing double key inputs according to the present invention. The circuit contains a key input part 10, a key signal generating part 20, a comparing circuit 30 and a detecting part 40.

The key input part 10 is provided with a plurality of keys J1–Jn, respectively, and is connected to resistors R11–R1n having different resistances and to a voltage-dividing resistor R1, for providing the set level of voltage if keys J1–Jn is pressed. The key signal generating part 20 is connected to the keys J1–Jn, the keys being connected to resistors R21–R2n through diodes D21–D2n respectively, a voltage-dividing resistor R2 being connected between each resistor R21–R2n and ground. The comparing circuit 30 comprises a comparator COMP1, and is connected to the key signal generating part 20. The comparator COMP1 has a negative input terminal which receives a reference voltage V2 by way of resistors R3, R4. A capacitor C is coupled in parallel with resistor R4. The comparator COMP1 provides a comparison output after comparing the reference voltage V2 with the output V1 of the key signal generating part 20. The detecting part 40 comprises a diode D1, and is connected to the output of the comparing circuit 30 and to the output line VL of the key input part 10. The detecting part 40 adds the output of the comparing circuit 30 to the output of the key input part 10' when the output of the comparing circuit 30 is at a high voltage level.

In the circuit shown in FIG. 2, a different output voltage V0 can be generated at each key J1–Jn by changing the setting of the resistances of the resistors R11–R1n connected to each key J1–Jn. This is because voltage Vcc of the power source is divided by way of the voltage-dividing resistor R1. Accordingly, if one of the keys J1–Jn is pressed, then the pressed key is detected by recognizing the intrinsic output voltage V0 without scanning the keys. This will be particularly described below.

If one of the keys J1–Jn is pressed, then the voltage Vcc of the power source is divided by the corresponding resistor of the resistors R21–R2n and the voltage-dividing resistor R2 in the key signal generating part 20, and the divided voltage V1 is applied to the non-inversion or positive input terminal(+) of the comparator COMP1 of the comparing circuit 30.

If the normal key input is given (i.e., only a signal key is depressed, then the voltage level of the inversion or negative input terminal (−), i.e., the level of the reference voltage V2 of the comparator COMP1 set by resistors R3, R4 of the comparing circuit 30, is higher than the voltage level of the non-inversion input terminal (+). Accordingly, in this case, the output of the comparing circuit 30 becomes a low voltage level, thereby being disconnected by the detecting part 40, and an output voltage V0 remains unchanged. That is, detecting part 40 (diode D1) is not turned ON since the output of COMP1 is low, and an open circuit between output V0 and the output of COMP1 results.

However, if two or more keys are pressed, an output voltage V0 of a predetermined level is generated in the key input part 10, and the division ratio of the voltage is changed because more than two of the resistors R21–R2n are disposed in parallel.

Accordingly, in this case, the output of the comparing circuit 30 becomes a high voltage level and the diode D1 of the detecting part 40 turns ON (i.e., becomes conducting) so that the output voltage level of the key input part 10 is elevated up to the output level of the detecting part 40. Therefore, because the output voltage V0 at the time of two or more key inputs is higher than that at the time of one key input, the existence of two or more key inputs can be easily recognized.

Meanwhile, if there is no key input, the output voltage V0 of the key input part 10 is not generated, and both the output of the comparing circuit 30 and the output of the detecting part 40 remain at a low voltage level. Accordingly, in this state the circuit doesn't operate, thereby not affecting the detection of one or two or more key inputs.

As described above, a circuit for recognizing double key inputs according to the present invention comprises the key input part 10 provided with a plurality of keys, for providing voltages corresponding to a level set by way of resistors upon key input, the key signal generating part 20 for providing a low voltage level in case of one key input and providing a high voltage level in case of two or more key inputs at the key input part 10, the comparing circuit 30, connected to the output of the key signal generating part 20, for providing a high voltage level at the time of one key input and a low voltage level at the time of two or more key inputs, and the detecting part 40, connected to the output of the comparing circuit and the key input part, for adding the output voltage of the comparing circuit 30 to the voltage of the output line so that the output voltage of the key input part becomes a high voltage level, so as to recognize the depression of two or more.

Thus, the key input is performed by way of a minimum number of key input lines, thereby enabling the key inputs to be recognized with a simple circuit. Moreover, two or more key inputs are easily detected, thereby assuring that such key input errors are detected.

The present invention is in no way limited to the specific embodiment described hereinabove. Various modifications of the disclosed embodiment of the present invention will become apparent to persons skilled in the art upon reference to the description of the present invention. Therefore, the appended claims are intended to cover any such modifications or embodiments as fall within the true scope of the present invention.

What is claimed is:

1. A circuit for providing an output signal which is used for recognizing a plurality of key inputs comprising:
   a key input circuit for providing voltages respectively corresponding to a plurality of keys;
   a key signal generating circuit for providing a low level signal when one of said plurality of keys is depressed, and for providing a high level signal when at least two of said keys are simultaneously depressed;
   a comparing circuit, connected to receive an output of said key signal generating circuit, for comparing the output of said key signal generating circuit to a predetermined reference signal, and for outputting a signal representing a result of said comparison; and
   a detecting circuit, connected to receive the output of said comparing circuit and the output of said key input circuit, for selectively adding the output of said comparing circuit to the output of said key input means so as to provide the output signal for use in recognizing a plurality of key inputs.

2. The circuit according to claim 1, wherein said comparing circuit comprises:
   reference voltage setting means connected to a power source; and
   a comparator having an inverted input terminal connected to said reference voltage setting means, and a non-inverted input terminal connected to said key signal generating circuit.

3. The circuit according to claim 2, wherein said detecting circuit comprises a diode.

4. The circuit according to claim 3, wherein an anode of said diode is connected to receive an output of said comparator, and a cathode of said diode is connected to receive the output of said key input circuit.

5. The circuit according to claim 3, wherein said key signal generating circuit comprises a plurality of diodes and a plurality of resistors connected in series with said plurality of diodes, respectively.

6. The circuit according to claim 5, wherein said plurality of diodes is connected to said plurality of keys, respectively.

7. The circuit according to claim 1, wherein said key input circuit comprises a power source connected to said plurality of keys, and a plurality of resistors connected in series with said plurality of keys, respectively.

* * * * *